United States Patent
Shimizu et al.

(10) Patent No.: US 10,128,419 B1
(45) Date of Patent: Nov. 13, 2018

(54) METHOD OF MANUFACTURING A LIGHT EMITTING DEVICE

(71) Applicant: Lumileds LLC, San Jose, CA (US)

(72) Inventors: Ken T. Shimizu, San Jose, CA (US); Hisashi Masui, San Jose, CA (US); Daniel B. Roitman, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/668,173

(22) Filed: Aug. 3, 2017

(51) Int. Cl.
*H01L 33/50* (2010.01)

(52) U.S. Cl.
CPC .......... *H01L 33/505* (2013.01); *H01L 33/501* (2013.01); *H01L 2933/0041* (2013.01)

(58) Field of Classification Search
CPC .............. H01L 33/501; H01L 33/505; H01L 2933/0041
See application file for complete search history.

(56) References Cited

U.S. PATENT DOCUMENTS

| | | | |
|---|---|---|---|
| 8,980,661 | B2 | 3/2015 | Ichikawa et al. |
| 9,293,643 | B2 | 3/2016 | Ichikawa |
| 2007/0215890 | A1 | 9/2007 | Harbers et al. |
| 2008/0137692 | A1 | 6/2008 | Park et al. |
| 2009/0244882 | A1* | 10/2009 | Samber .................. H01L 33/507 362/84 |
| 2012/0074835 | A1* | 3/2012 | Piquette .................. H01L 33/44 313/501 |
| 2013/0146918 | A1* | 6/2013 | Chen .................. C09K 11/7774 257/98 |
| 2013/0258637 | A1* | 10/2013 | Wang .................. H01L 33/505 362/84 |
| 2014/0175491 | A1* | 6/2014 | Sanga .................. H01L 33/505 257/98 |
| 2015/0198303 | A1* | 7/2015 | Park .................. C09K 11/02 428/325 |
| 2018/0159001 | A1* | 6/2018 | Schricker .................. H01L 33/56 |

FOREIGN PATENT DOCUMENTS

| | | |
|---|---|---|
| WO | 2007/144809 A1 | 12/2007 |
| WO | 2016/200739 A1 | 12/2016 |
| WO | 2017/023502 | 2/2017 |

OTHER PUBLICATIONS

Bechtel et al, "Lumiramic: A New Phosphor Technology for High Performance Solid State Light Sources," Proc. SPIE 7058, Eighth International Conference on Solid State Lighting, 70580E (Sep. 2, 2008).

Cappella et al., "High Temperature Thermal Conductivity of Amorphous Al2O3 Thin Films Grown by Low Temperature ALD," Advanced Engineering Materials. 15. 1046-1050 (2013).

Leskelä et al., "Atomic layer deposition (ALD): from precursors to thin film structures," Thin Solid Films. 409. 138-146 (2002).

\* cited by examiner

*Primary Examiner* — Allan R Wilson
(74) *Attorney, Agent, or Firm* — Volpe and Koenig, P.C.

(57) ABSTRACT

A method of manufacturing of a Light Emitting Device that has increased reliability and efficiency. Specifically, the disclosed methods uses Atomic Layer Deposition to improve the thermal conductivity between the ceramic plate and the LED, decrease the amount of organic contamination, and increase the efficiency of the optical output of the Light Emitting Device.

20 Claims, 9 Drawing Sheets

METHOD OF MANUFACTURING A LIGHT EMITTING DEVICE

FIELD OF INVENTION

This disclosure relates to a method of manufacturing of a Light Emitting Device that utilizes Atomic Layer Deposition (ALD) to attach a light converting plate to a light emitting diode (LED).

BACKGROUND

Commonly, in the manufacturing of Light Emitting Device, LED phosphors are deposited over active light emitters in a powder or liquid suspension. To improve phosphor uniformity and simplify wafer, chip scale, or flip chip manufacture, phosphors distributed in a light transparent ceramic have also been developed. Such ceramics can be formed as plates (or platelets) with a controlled amount of phosphor powder being placed in a mold and heated under pressure to sinter the grains together. The platelet can be made very smooth on all surfaces, suitable for attachment.

One example of a ceramic platelet is Lumiramic™. Lumiramic is a phosphor platelet formed from polycrystalline ceramic plate of Ce (III) doped yttrium gadolinium aluminum garnet (Y,GdAG:Ce). The technical properties of Lumiramic are described in "Lumiramic: a new phosphor technology for high performance solid state light sources" (Bechtel, Helmut, Peter Schmidt, Wolfgang Busselt, and Baby S. Schreinemacher. "Lumiramic: A New Phosphor Technology for High Performance Solid State Light Sources." Eighth International Conference on Solid State Lighting (2008): n. pag. Online), which is hereby incorporated by reference.

In some applications, Lumiramic plates can be combined with a blue LED to produce white light in the range of 5000 K correlated color temperature. In one automotive application, a Lumiramic platelet is glued to a blue LED using a silicone polymer glue that allows for heat conduction from the phosphor layer into the LED and heat sink as well as providing optical coupling of blue light into the Lumiramic plate to form white light. In other applications, a light emitting element is bonded to the Lumiramic plate using a surface activated bonding technique that relies on sputter etching with ion beams or plasma on a bonding surface of a light emitting element.

A bonding technique that does not require adhesives is atomic layer deposition (ALD). Atomic Layer Deposition (ALD) is a process in which a thin film deposition method in which a film is grown on a substrate by exposing its surface to alternate precursor gases. Methods for performing ALD are known in the art and for example are taught in "Atomic layer deposition (ALD): from precursors to thin film structures" (Leskeia, Markku, and Mikko Ritala. "Atomic Layer Deposition (ALD): From Precursors to Thin Film Structures." Thin Solid Films 409.1 (2002): 138-46. Print.), which is hereby incorporated herein by reference.

SUMMARY

A method of manufacturing of a Light Emitting Device that has increased reliability and efficiency. Specifically, the disclosed methods use Atomic layer deposition to improve the thermal conductivity between the ceramic plate and the LED, decrease the amount of organic contamination, and increase the efficiency of the optical output of the Light Emitting Device.

The reduction in organic contamination, and the increase in the efficiency may be particularly useful with Thin-Film side coat LED architectures. For example, World Intellectual Property Organization Publication 2017023502 A1 to Masui et al., which is hereby incorporated herein by reference, describes an example of a LED based on a Thin-Film side coat LED architecture that may benefit from the present disclosed method of manufacturing of a Light Emitting Device.

DETAILED DESCRIPTION OF THE PREFERRED EMBODIMENTS

Figure 1:
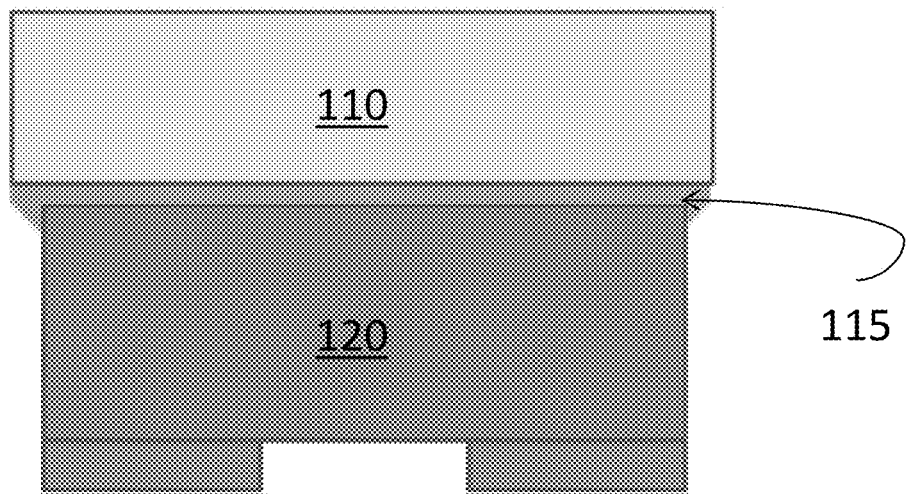
FIG. 1 depicts a Light Emitting Device made using the prior art methods.

FIG. 1 depicts a light emitting device 100 formed using a polymer glue layer 115 bonded between a plate 110 and light emitting diode 120. The polymer glue layer 115 is formed by applying a polymer glue layer (such as a Polydimethylsiloxane based silicone) to either the plate 110 or the light emitting diode 120 and then squeezing the plate 110 and the light emitting diode 120 together. The squeezing of polymer glue between the plate 110 and the light emitting diode 120 often results in the polymer glue leaking out on to the sidewalls of the plate 110 or the light emitting diode 120. The leaking polymer glue adversely affects the optical efficiency of the light emitting device 100. The adverse effects are particularly acute in Thin-Film side coat LED architectures where dielectric broadband mirrors (DBMs) are utilized.

In addition, the inclusion of the polymer glue layer between the plate 110 and light emitting diode 120 impairs the performance and the reliability of the light emitting device 100. For example, the polymer glue used in forming the polymer glue layer 115 is prone to photo-thermal degradation because the polymer glue may either contribute to or is sensitive to organic contamination in the light emitting device 100. In addition, Polymer glues are also poor thermal conductors and typically have a thermal conductivity of approximately 0.2 W/mK. Accordingly, the polymer glue layer 115 is unable to efficiently transfer heat generated by the light emitting diode 120 to the plate 110. Further, the polymer glue has a low refraction index (RI) (of approximately 1.42~1.54) as compared to the refraction index of the plate 110 (RI 1.8) and the light emitting diode 120 (RI 1.8~2.5 depending on LED die architecture). The low refractive index of the polymer glue layer 115 results in less light being transferred from the light emitting diode 120 to the plate 110 which translates to a light emitting device 100 with lower efficiency.

Figure 2:
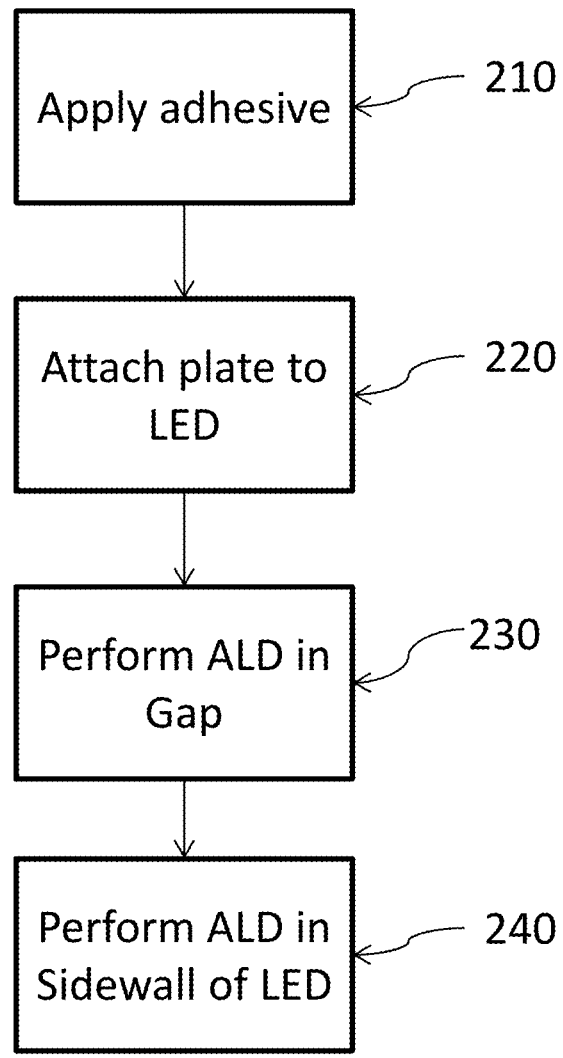
FIG. 2 depicts a process flow map of an embodiment of the invention.
Figure 3A:
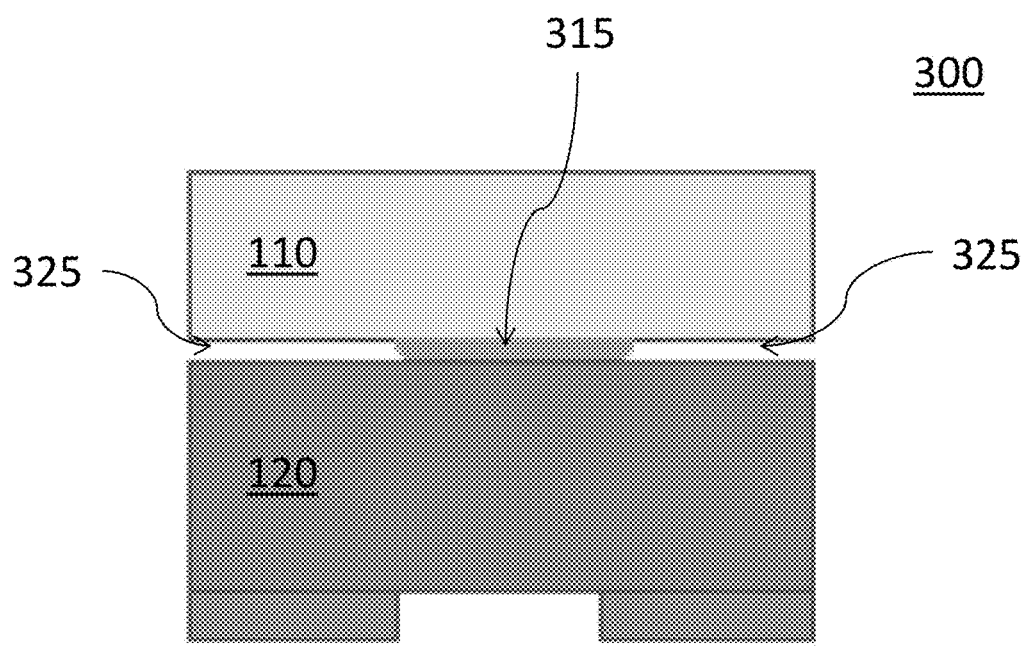
FIG. 3A depicts a Light Emitting Device in the process of being formed by an embodiment of the invention.
Figure 3B:
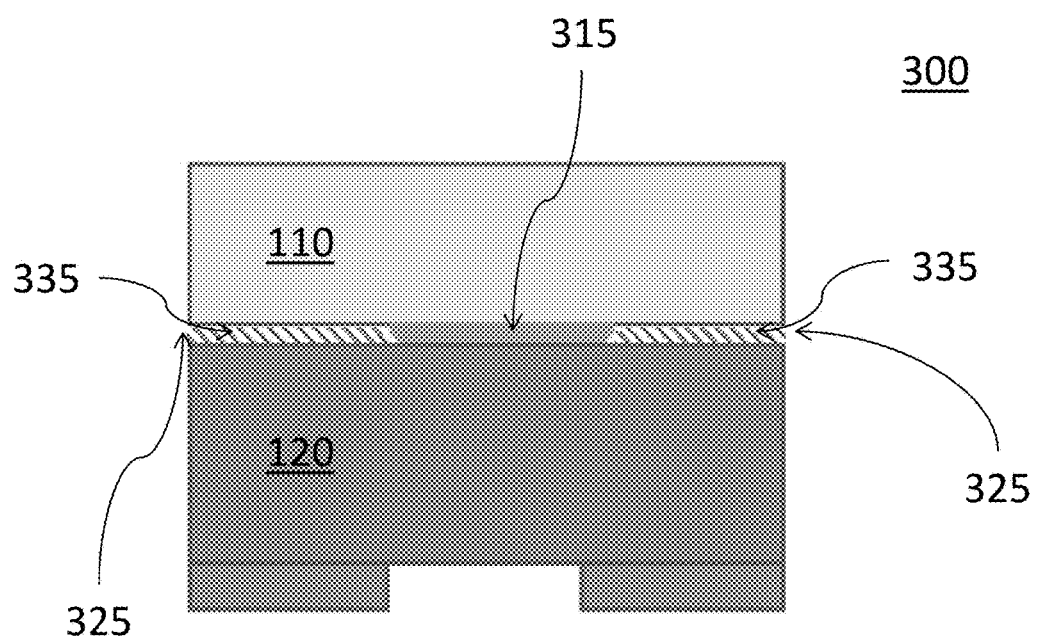
FIG. 3B depicts a Light Emitting Device in the process of being formed by an embodiment of the invention.
Figure 3C:
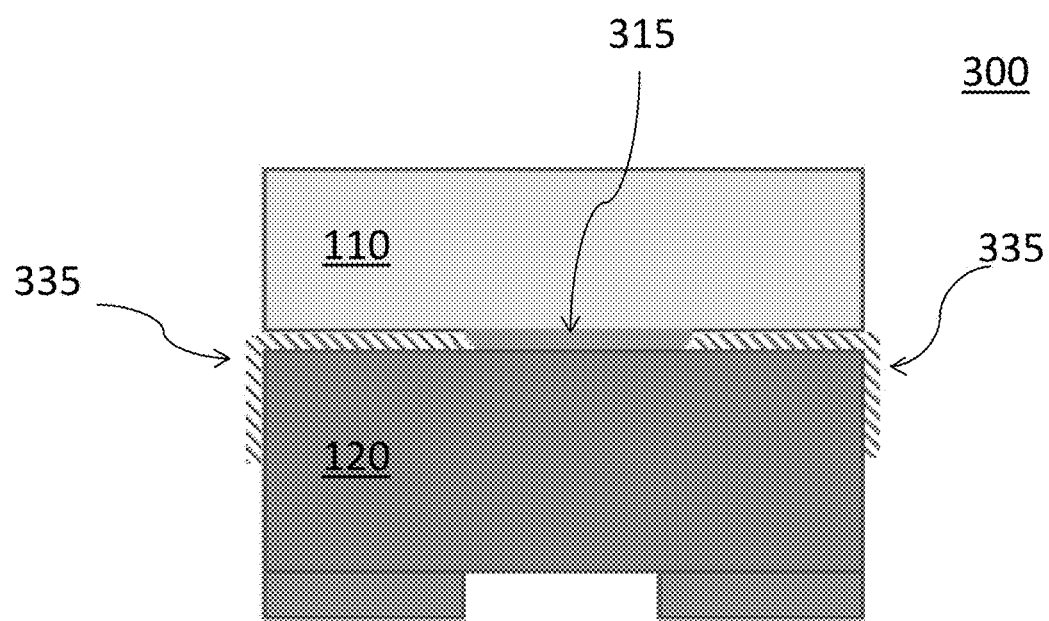
FIG. 3C depicts a Light Emitting Device in the process of being formed by an embodiment of the invention.
Figure 4A:
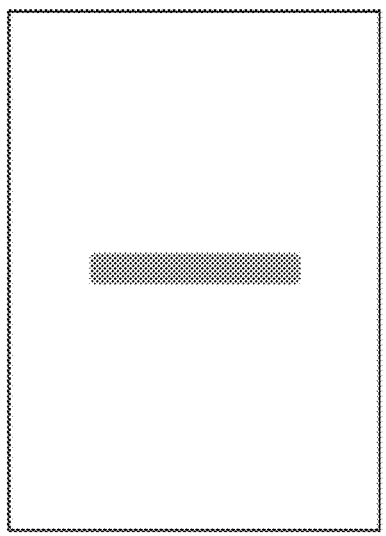
FIG. 4A depicts an example adhesive location and pattern.
Figure 4B:
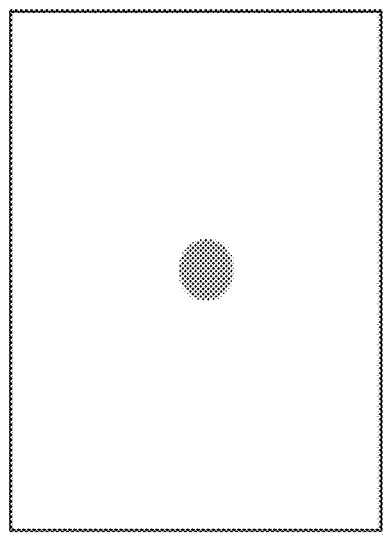
FIG. 4B depicts an example adhesive location and pattern.
Figure 4C:
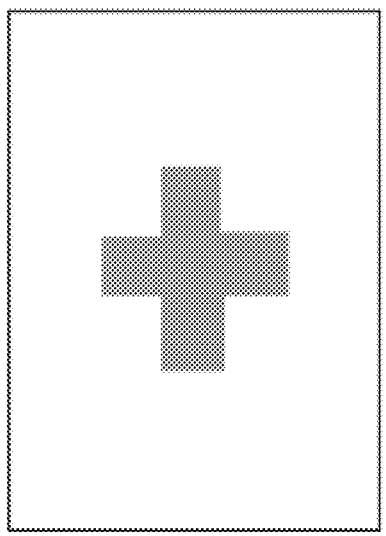
FIG. 4C depicts an example adhesive location and pattern.
Figure 4D:
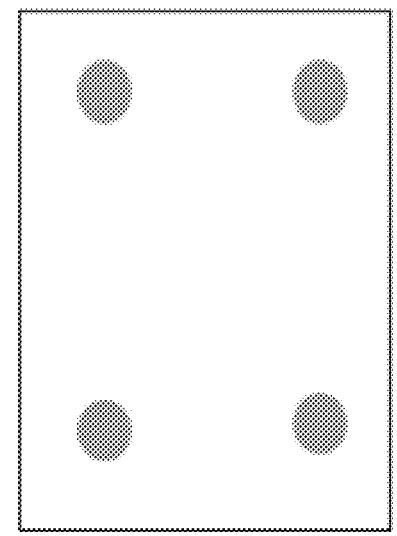
FIG. 4D depicts an example adhesive location and pattern.

FIG. 2 depicts a process flow diagram of an embodiment of the invention for creating light emitting device 300 (shown in FIGS. 3A-3C). In step 210, a small amount of adhesive 315 is applied to either the plate 110 or light emitting diode 120. The small amount of adhesive 315 has an area that is much smaller than the surface area of the surface area of the plate 110 or light emitting diode 120. In step 220, the plate 110 and the light emitting diode 120 are attached using the small amount of adhesive 315. Once attached, the plate 110 and light emitting diode 120 are separated by a distance of approximately 1 µm. When the plate 110 and the light emitting diode 120 are attached, a Gap 325 is formed between the plate 110 and the light emitting diode 120 in areas where the adhesive 315 is not applied. Then in step 230, ALD of a transparent material 335 is performed to fill the gap 325. Additionally, in some embodiments, ALD of the transparent material may be performed on the sidewall of the light emitting diode 120 in step 240.

FIG. 3A is a graphic depiction of the light emitting device 300 after the completion of step 220. Specifically, FIG. 3A shows the plate 110 connected to the light emitting diode 120 by the small amount of adhesive 315. The connection of plate 110 to the light emitting diode 120 by the small amount of adhesive 315 results in the formation of gaps 325. In some embodiments, the adhesive 315 may be silicone or sol-gel glue. In other embodiments, the adhesive 315 may be a low-melting point glass or transparent adhesive.

The light emitting device 300 after the completion of step 230 is depicted in FIG. 3B. FIG. 3B shows the transparent material 335 that has been applied by ALD to fill gap 325. By using ALD to fill the gap 325, flatness, irregularities or slight curvature in either the plate 110 or the light emitting diode 120 can be compensated for. In some embodiments, the transparent material 335 may be Alumina ($Al_2O_3$), Niobium oxide ($Nb_2O_5$), Zirconia ($ZrO_2$), or other high index dielectrics.

In many embodiments, the refraction index of the transparent material 335 is selected to match the index of refraction of the light emitting diode 120. Selecting a transparent material 335 that has a matched index of refraction to light emitting diode 120 may be desirable because the light from the LED can typically be trapped due to total internal reflection from the higher index media entering into a lower index media. Since there is always a finite probability of light absorption in the LED structure, this light trapping results in light output efficiency loss. By matching the refractive index, this loss mechanism is reduced or eliminated.

The ALD coated dielectric may also have a higher thermal conductivity (~3 W/mK) compared to silicone polymers. The thermal properties of ALD coated dielectrics are discussed in "High Temperature Thermal Conductivity of Amorphous $Al_2O_3$ Thin Films Grown by Low Temperature ALD" (Cappella, Andrea, Jean-Luc Battaglia, Vincent Schick, Andrzej Kusiak, Alessio Lamperti, Claudia Wiemer, and Bruno Hay. "High Temperature Thermal Conductivity of Amorphous Al2O3 Thin Films Grown by Low Temperature ALD." Advanced Engineering Materials 15.11 (2013): 1046-050. Print.), which is hereby incorporated herein by reference. Using a ALD coated dielectric with a higher thermal conductivity, may be desirable because heat is generated in the Lumiramic layer and the most efficient path for heat dissipation occurs through the bonding layer into the diode device. All phosphor materials show thermal quenching or loss in efficiency at high temperatures at the higher temperature and higher flux intensities. Therefore, the lowering temperature of the lumiramic or phosphor layer results in improved light output for the white LED.

FIG. 3C depicts the light emitting device 300 after the completion of step 240. In some embodiments, step 240 may be omitted or performed concurrently with step 230. FIG. 3C shows the transparent material 335 deposited on the sidewall of the light emitting diode 120. Sidewall covering with a reflective surface is important to maximize the color uniformity of the light source and to help direct the light in the forward direction. High brightness LEDs typically require this color uniformity and directionality in applications such as flash LEDs or automotive headlight LEDs.

FIGS. 4A, 4B, 4C and 4D depict different patterns and locations where the adhesive 315 may be applied to either plate 110 or the light emitting diode 120. The particular pattern and location to apply the adhesive 315 may be selected in order to minimize the possibility that the ALD process does not completely fill the gap 325. Closed patterns with separate interior area (such as donut "holes") are not preferred, since ALD would not occur in the interior areas.

Figure 5:
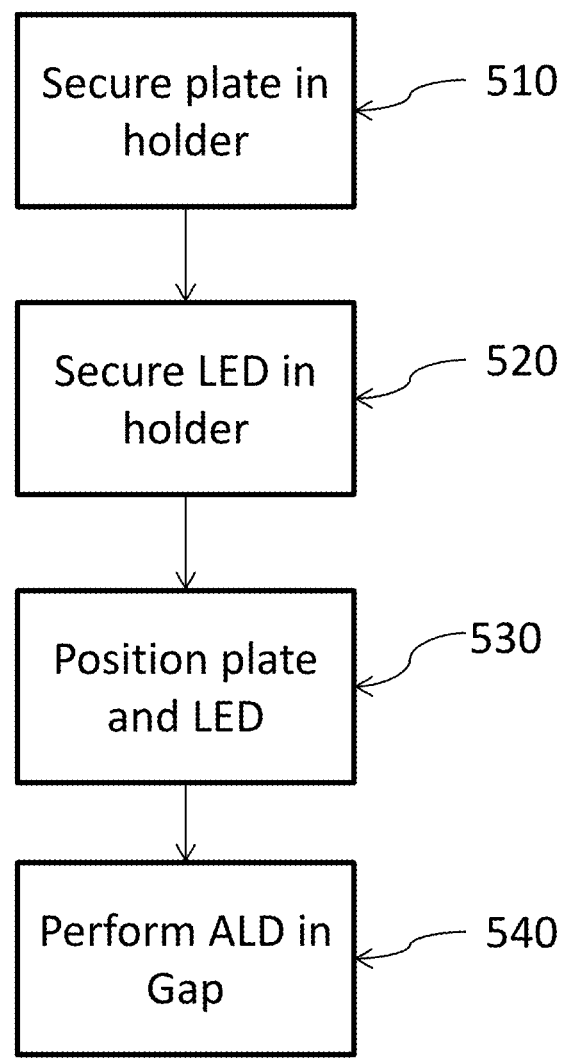
FIG. 5 depicts a process flow map of a second embodiment of the invention.

FIG. 5 depicts a process map for an alternate embodiment of the invention. In this embodiment, the plate 110 is secured in a mechanical holder (step 510) and the light emitting diode 120 is secured in a mechanical holder (step 520). Then, the plate 110 and light emitting diode 120 are positioned to form gap 625 (shown in FIGS. 6A and 6B). Gap 625 has a thickness of approximately 1 µm (step 530). Then, in step 540, ALD of a transparent material 335 is performed to fill the gap 625.

Figure 6A:
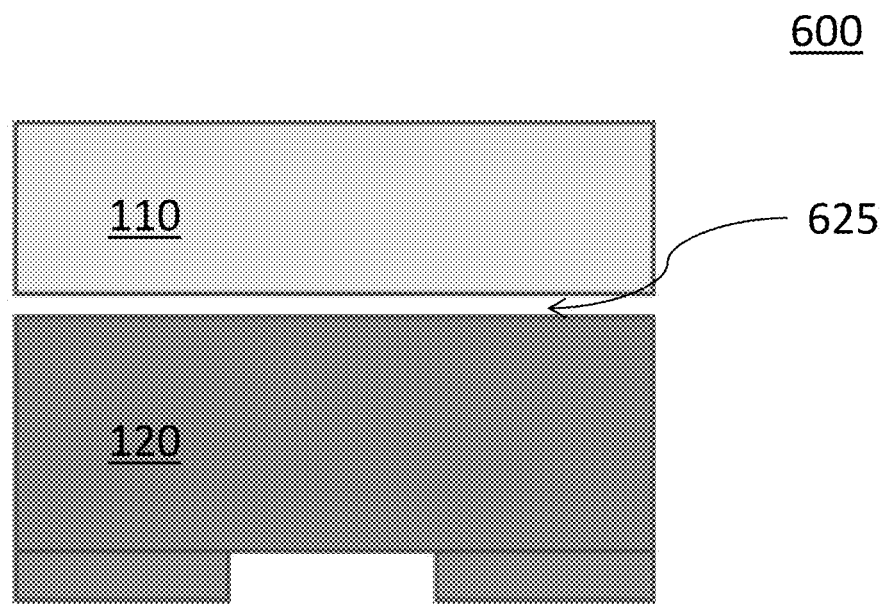
FIG. 6A depicts a Light Emitting Device in the process of being formed by the second embodiment of the invention.
Figure 6B:
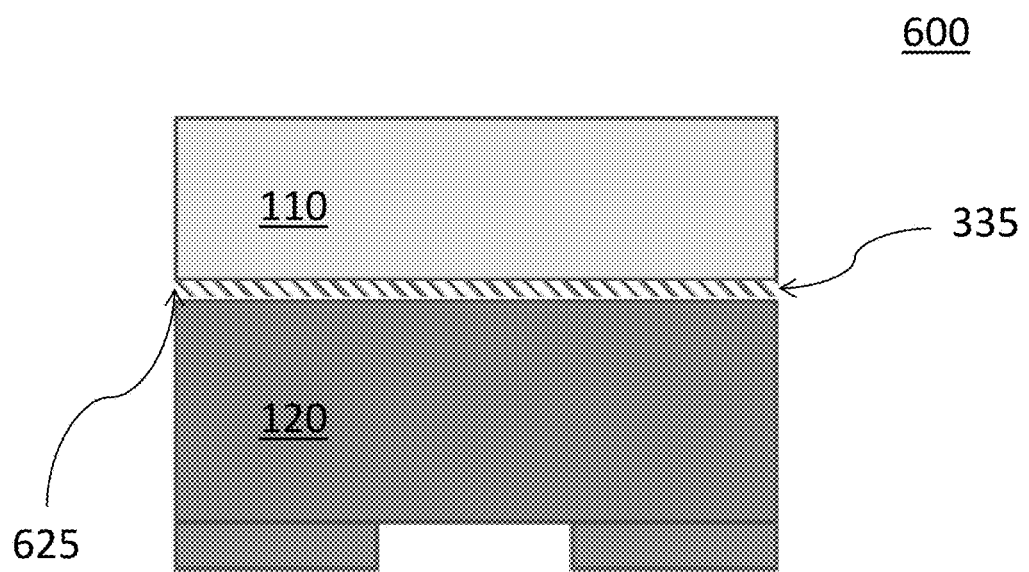
FIG. 6B depicts a Light Emitting Device in the process of being formed by the second embodiment of the invention.

The light emitting device 600, after the completion of step 530, is depicted in FIG. 6A. FIG. 6B shows the light emitting device 600 after the ALD of the transparent material 335 is performed to fill the gap 625 in step 540.

In some embodiments, the plate 110 may be a ceramic phosphor plate such as a Lumiramic or a phosphor filled platelet made in a glass or silicone matrix. In some embodiments, the light emitting diode 120 may be a vertical thin film or a thin-film flip chip, or a CSP flip-chip based LED.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

What is claimed is:

1. A method of manufacturing a light emitting device comprising:
    applying an adhesive to a portion of a ceramic phosphor plate, wherein the portion of the ceramic phosphor plate has a smaller surface area than a surface area of the ceramic phosphor plate;
    forming a gap between a light emitting diode and the ceramic phosphor plate by affixing the ceramic phosphor plate to the light emitting diode using the adhesive applied to the portion of the ceramic phosphor plate; and
    filling the gap with a transparent material by atomic layer deposition.

2. The method of claim 1, further comprising:
    coating sidewalls of the light emitting diode with the transparent material by atomic layer deposition.

3. The method of claim 1, wherein the adhesive is silicone or sol-gel glue.

4. The method of claim 1, wherein the adhesive is a low melting point glass.

5. The method of claim 1, wherein the transparent material has a same index of refraction as the light emitting diode.

6. The method of claim 1, wherein the transparent material is Alumina or $Al_2O_3$.

7. The method of claim 1, wherein the portion of the ceramic plate includes a plurality of discrete regions.

8. The method of claim 1, wherein the portion of the ceramic plate has a cross-sectional area in a shape of a cross.

9. The method of manufacturing according to claim 1, wherein the portion of the ceramic plate has a cross-sectional area substantially in a shape of a line.

10. The method of manufacturing according to claim 1, wherein the ceramic phosphor plate is Lumiramic.

11. A method of manufacturing a light emitting device comprising:
    applying an adhesive to a portion of a light emitting diode, wherein the portion of the light emitting diode has a smaller surface area than a surface area of the light emitting diode;
    forming a gap between the light emitting diode and a ceramic phosphor plate by affixing the ceramic phosphor plate to the light emitting diode using the adhesive applied to the portion of the light emitting diode; and
    filling the gap with a transparent material by atomic layer deposition.

12. The method of manufacturing according to claim 11, further comprising:
    coating sidewalls of the light emitting diode with the transparent material by atomic layer deposition.

13. The method of claim 1, wherein the adhesive is silicone or sol-gel glue.

14. The method of claim 11, wherein the adhesive is a low melting point glass.

15. The method of claim 11, wherein the transparent material has a same index of refraction as the light emitting diode.

16. The method of claim 11, wherein the transparent material is Alumina or $Al_2O_3$.

17. The method of claim 11, wherein the portion of the light emitting diode includes a plurality of discrete regions.

18. The method of claim 11, wherein the portion of the light emitting diode has a cross-sectional area in a shape of a cross.

19. The method of claim 11, wherein the portion of the light emitting diode has a cross-sectional area in a shape of a line.

20. The method of claim 11, wherein the ceramic plate is Lumiramic.

* * * * *